US011386345B2

(12) United States Patent
Granade et al.

(10) Patent No.: US 11,386,345 B2
(45) Date of Patent: Jul. 12, 2022

(54) STRONG SIMULATION METHODS FOR UNIT TESTING QUANTUM SOFTWARE

(71) Applicant: Microsoft Technology Licensing, LLC, Redmond, WA (US)

(72) Inventors: Christopher Granade, Redmond, WA (US); Vadym Kliuchnikov, Redmond, WA (US); Andres C. Paz, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 546 days.

(21) Appl. No.: 16/023,908

(22) Filed: Jun. 29, 2018

(65) Prior Publication Data
US 2019/0180197 A1 Jun. 13, 2019

Related U.S. Application Data

(60) Provisional application No. 62/596,620, filed on Dec. 8, 2017.

(51) Int. Cl.
*G06N 7/00* (2006.01)
*B82Y 10/00* (2011.01)
(Continued)

(52) U.S. Cl.
CPC .............. *G06N 10/00* (2019.01); *B82Y 10/00* (2013.01); *G06F 11/3604* (2013.01); *G06F 30/20* (2020.01); *G06N 7/005* (2013.01)

(58) Field of Classification Search
CPC ........ G06N 10/00; G06N 7/005; G06F 30/20; G06F 11/3604; G06F 30/25; G06F 30/27;
(Continued)

(56) References Cited

U.S. PATENT DOCUMENTS

2006/0224547 A1* 10/2006 Ulyanov ................ G06N 10/00 706/62
2011/0238378 A1* 9/2011 Allen ..................... G06N 10/00 702/186

(Continued)

FOREIGN PATENT DOCUMENTS

CA 2470715 A1 7/2003

OTHER PUBLICATIONS

Ying et al. "Invariants of Quantum Programs: Characterisations and Generation" POPL' 17, Paris, France, pp. 818-832 (Jan. 2017) doi:10.1145/3009837.3009840 [retrieved on Oct. 8, 2020]. (Year: 2017).*

(Continued)

*Primary Examiner* — Rehana Perveen
*Assistant Examiner* — Alfred H B Wechselberger
(74) *Attorney, Agent, or Firm* — Klarquist Sparkman, LLP

(57) ABSTRACT

The disclosed technology includes example embodiments that provide a framework for testing quantum programs in a manner similar to unit testing of classical programs by using a simulator that can predict the probability of measurements in a quantum system (known as a "strong simulator"). For a particular quantum program, embodiments of the disclosed technology use information exposed by strong simulation that would not otherwise be available to compare the given program to a desired reference program.

16 Claims, 8 Drawing Sheets

(51) Int. Cl.
*G06N 10/00* (2022.01)
*G06F 11/36* (2006.01)
*G06F 30/20* (2020.01)

(58) Field of Classification Search
CPC .. G06F 30/28; G06F 2111/00–2119/22; B82Y 10/00
See application file for complete search history.

(56) References Cited

U.S. PATENT DOCUMENTS

| | | | | |
|---|---|---|---|---|
| 2016/0063390 A1* | 3/2016 | Mytkowicz | ............ | G06N 5/048 706/52 |
| 2016/0210560 A1* | 7/2016 | Alboszta | ................ | G06N 10/00 |

OTHER PUBLICATIONS

Wang, D. "Weak, strong, and uniform quantum simulations" Physical Review A, vol. 91, No. 012334 [retrieved on Oct. 7, 2020]. (Year: 2015).*
Behera et al. "Experimental realization of quantum cheque using a five-qubit quantum computer" Quantum Information Process, vol. 16, No. 312, Springer, doi:10.1007/s11128-017-1762-0 (Nov. 2017) [retrieved on Oct. 7, 2020]. (Year: 2017).*
Patrzyk, J. "Graphical and programming support for simulations of quantum computations" [thesis] AGH University of Science and Technology, Krakow [retrieved on Oct. 7, 2020]. (Year: 2014).*
D'Ariano et al. "Quantum Theory is an Information Theory The Operational Framework and the Axioms" Foundations of Physics, vol. 46, No. 3, pp. 269-281 [retrieved on Oct. 7, 2020] (Year: 2016).*
"Quantum tomography" Wikipedia.com, Sep. 2017 [retrieved on Oct. 9, 2020] (Year: 2017).*
Broadbent et al. "Quantum One-Time Programs" Canetti et al. (Eds.) in Crypto 2013, Part II, LNCS 8043, pp. 344-360 [retried on Oct. 7, 2020] (Year: 2013).*
Bettelli et al. "Toward an architecture for quantum programming" European Physics Journal D, vol. 25, pp. 181-200, doi:10.1140/epjd/e2003-00242-2 [retrieved on Oct. 9, 2020] (Year: 2003).*
Liu et al. "Q|SI> : A Quantum Programming Environment" arXiv: 1710.09500 (Oct. 2017) [retrieved on Oct. 7, 2020]. Retrieved from arVix.org <https://arxiv.org/abs/1710.09500> (Year: 2017).*
Zwerger et al. "Measurement-based quantum communication" Applied Physics B: Lasers and Optics, vol. 122, No. 50, doi:10.1007/s00340-015-6285-8 [retrieved on Oct. 9, 2020] (Year: 2016).*
Perdix, S. "Towards minimal resources of measurement-based quantum computation" New Journal of Physics, vol. 9, No. 206; doi: 10.1088/1367-2630/9/6/206 [retrieved on Sep. 11, 2021] (Year: 2007).*
Montina, A. "State-space dimensionality in short-memory hidden-variable theories" Physical Review A, vol. 83, 032107 [retrieved on Sep. 11, 2021] (Year: 2011).*
Granade et al. "QInfer: Statistical inference software for quantum applications" Quantum vol. 1, No. 5 (Apr. 2017) [retrieved on Sep. 11, 2021] (Year: 2017).*
Sabry et al. "Modeling Quantum Computing in Haskell" Proceedings of the 2003 ACM SIGPLAN workshop on Haskell; https://doi.org/10.1145/871895.871900 [retrieved on Sep. 11, 2021] (Year: 2003).*
Koh, D. "Further Extensions of Clifford Circuits and Their Classical Simulation Complexities" Quantum Information and Computation, vol. 17, No. 3 [retrieved on Sep. 11, 2021] (Year: 2015).*
Omer, B. "Quantum Programming in QCL" Institute of Information Systems, Technical University of Vienna [retrieved on Feb. 16, 2022 ] (Year: 2000).*
Schuchman et al. "A Program Transformation and Architecture Support for Quantum Uncomputation" ASPLOS06 Oct. 21-25, 2006, San Jose, California, USA; https://doi.org/10.1145/1168857.1168889 (Year: 2006).*
Bergfeld et al. "A Decidable Dynamic Logic for Quantum Reasoning" Electronic Proceedings of QPL (2012) [retrieved on Feb. 16, 2022] (Year: 2012).*
Bruns et al. "Witnessing random unitary and projective quantum channels: Complementarity between separable and maximally entangled states" Physical Review A, vol. 93, 032132 (2016) [retrieved on Feb. 16, 2022] (Year: 2016).*
Altepeter et al., "Ancilla-assisted quantum process tomography," *Journal of Physical Review Letters*, vol. 90, pp. 1-4 (May 2003).
Puzzuoli et al., "Tractable Simulation of Error Correction with Honest Approximations to Realistic Fault Models," *Journal of Physical Review A*, vol. 89, pp. 1-34 (Feb. 2014).
Anticoli et al., "Verifying Quantum Programs: From Quipper to QPMC," arXiv:1708.06312v1, pp. 1-18 (Aug. 2017).
Bergfeld et al., "Deriving the correctness of quantum protocols in the probabilistic logic for quantum programs," *Soft Computing*, vol. 21, No. 6, pp. 1421-1440 (Aug. 2015).
International Search Report and Written Opinion dated Mar. 20, 2019, from International Patent Application No. PCT/US2018/063533, 14 pp.
Rand et al., "QWIRE Practice: Formal Verification of Quantum Circuits in Coq," *Int'l Conf. on Quantum Physics and Logic and IQSA Quantum Structures Workshop*, pp. 1-14 (Jul. 2017).
"Office Action Issued in European Patent Application No. 18830975.1", dated Feb. 7, 2022, 8 Pages.
Mingsheng, et al., "Quantum programming: From theories to implementations", In Journal of Chinese Science Bulletin, vol. 57, Issue 16, Jun. 2012, pp. 1903-1909.
Paykin, et al., "QWIRE: A Core Language for Quantum Circuits", In Proceedings of the 44th ACM SIGPLAN Symposium on Principles of Programming Languages, Jan. 15, 2017, pp. 846-858.
Ying, et al., "Verification of Quantum Programs", In Repository of arXiv: 1106.4063v1, Jun. 21, 2011, pp. 1-26.

* cited by examiner

STRONG SIMULATION METHODS FOR UNIT TESTING QUANTUM SOFTWARE

CROSS-REFERENCE TO RELATED APPLICATIONS

This application claims the benefit of U.S. Provisional Application No. 62/596,620 entitled "STRONG SIMULATION METHODS FOR UNIT TESTING QUANTUM SOFTWARE" and filed on Dec. 8, 2017, which is hereby incorporated herein by reference in its entirety.

SUMMARY

The disclosed technology includes example embodiments that provide a framework for testing quantum programs in a manner similar to unit testing of classical programs by using a simulator that can predict the probability (e.g., the exact probability) of measurements in a quantum system (known as a "strong simulator"). For a particular quantum program, embodiments of the disclosed technology use information exposed by strong simulation that would not otherwise be available to compare the given program to a desired reference program.

Previous approaches have been developed within the context of characterizing and certifying quantum processes developed for experimental use. By contrast, certain embodiments of the disclosed technology employ quantum characterization in the context of a quantum programming language coupled to a strong quantum simulator to provide unit testing methodologies.

Embodiments of the disclosed technology provide methods to test the correctness of quantum programs on a strong simulator of quantum dynamics using concepts from quantum information theory and open quantum system.

The non-physical resources provided by a strong simulator also enable testing properties of a quantum program that would otherwise not be directly testable, such as the correctness of a quantum program conditioned on classical randomness. Existing approaches can only directly test the average behavior of a quantum program.

Particular embodiments comprise using assertions about exact probabilities of incompatible measurements to test quantum states in a strong quantum simulator against classical descriptions of expected states. In certain implementations of such embodiments, the Choi-Jamiłkowski isomorphism is used to reduce assertions about quantum programs to assertions about quantum states in a time-efficient manner. In other embodiments, a SWAP test is used to reduce assertions about unitary quantum programs to assertions about quantum states in a memory-efficient manner. Further embodiments include the testing of "single-shot" behavior rather than average behavior of a quantum program.

The foregoing and other objects, features, and advantages of the disclosed technology will become more apparent from the following detailed description, which proceeds with reference to the accompanying figures.

DETAILED DESCRIPTION

I. General Considerations

As used in this application, the singular forms "a," "an," and "the" include the plural forms unless the context clearly dictates otherwise. Additionally, the term "includes" means "comprises." Further, the term "coupled" does not exclude the presence of intermediate elements between the coupled items. Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

II. Overview

Embodiments of the disclosed technology adapt ideas from quantum characterization, namely process tomography, to reduce the problem of asserting a quantum operation acts as expected to the problem of asserting that a quantum state is equal to a particular expected state. This latter problem can then be efficiently solved by interaction with a strong quantum simulator much more efficiently than it can be solved on an actual physical implementation (a physical implementation of quantum computing device). For instance, a strong simulator, such as a matrix-vector simulator, can report the probability of any particular measurement without performing the measurement and collapsing the state of interest—this is not consistent with the no-cloning theorem, and represents that the classical information used to implement a simulator can be readily cloned.

Figure 1:
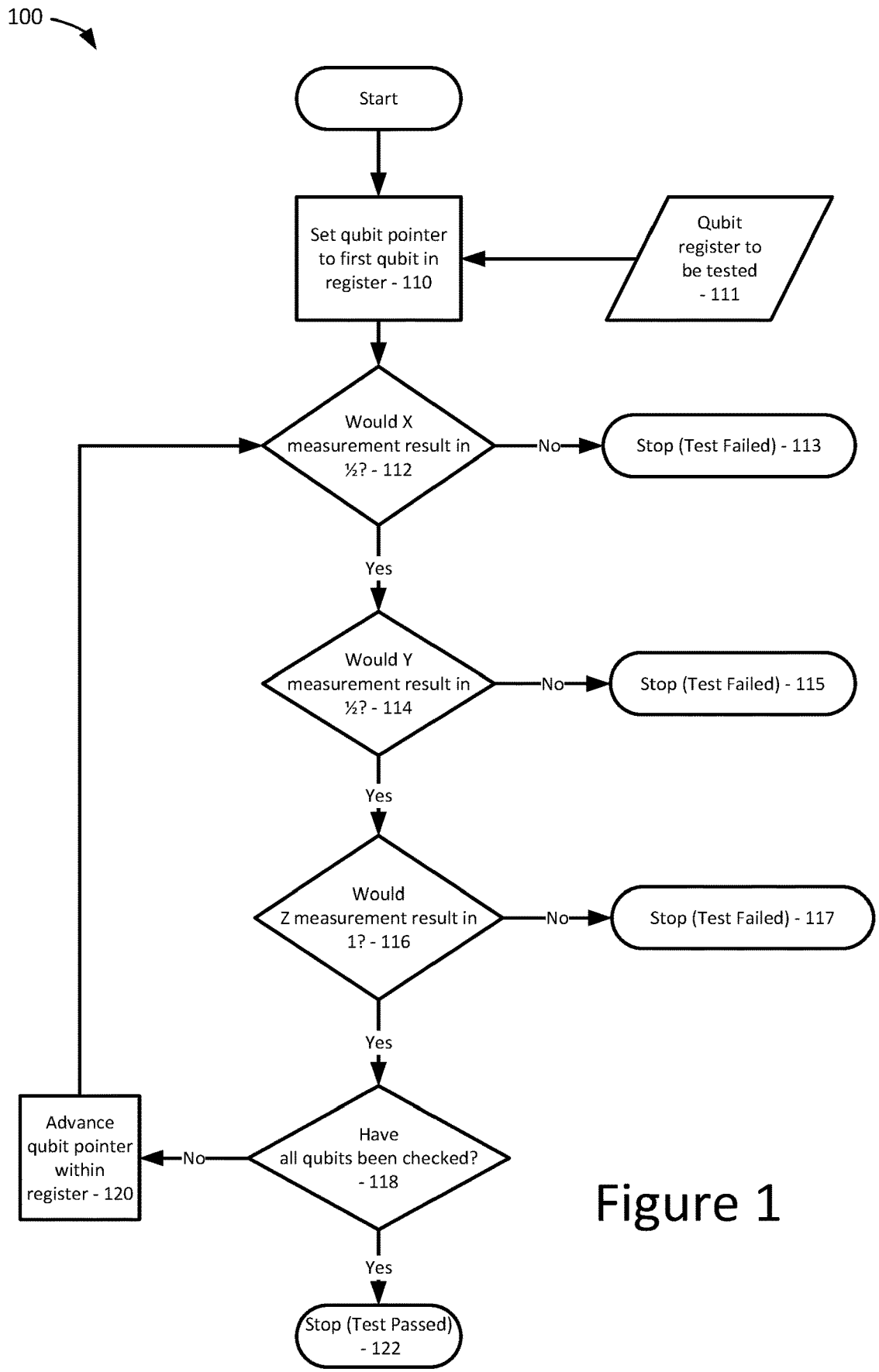
FIG. 1 is a flowchart of an example procedure for testing whether an arbitrary quantum state is in the all-zeros state.

Using this idea, one can efficiently test whether an arbitrary quantum state is in the all-zeros state by asserting that the reduced density operator on each individual qubit is the pure zero state on that qubit. An example procedure for testing whether an arbitrary quantum state is in the all-zeros state is shown in flow chart 100 of FIG. 1. It should be understood that the particular ordering shown in FIG. 1 is by way of example only. For instance, the x, y, and z measurements can be tested in a different order, or a different reference state may be used, resulting in different probabilities for each measurement, depending on the implementation.

In more detail, FIG. 1 is a flowchart 100 showing an example embodiment for implementing an embodiment of the disclosed technology. The particular operations and sequence of operations should not be construed as limiting, as they can be performed alone or in any combination, subcombination, and/or sequence with one another. Additionally, the illustrated operations can be performed together with one or more other operations.

At 110, a qubit pointer is set to the first qubit in the register based on the qubit register to be tested (shown at 111).

At 112, an evaluation is made as to whether an X measurement would result in a positive result with a probability of ½. If not, then at 113, the test is determined to have failed and the process is stopped. In more detail, the process that is illustrated is checking if the quantum state of the qubit at the pointer is $|0\rangle$, which has a probability 1 of returning a +1 eigenvalue when Z is measured, and a probability ½ of returning a +1 eigenvalue when either X or Y is measured. In general, a reference state other than $|0\rangle$ can be used, in which case the expected probabilities for X, Y and Z measurements can be readily computed.

At 114, an evaluation is made as to whether an Y measurement would result in a positive result with a probability of M. If not, then at 115, the test is determined to have failed and the process is stopped.

At 116, an evaluation is made as to whether an Z measurement would result in a positive result with a probability of 1. If not, then at 117, the test is determined to have failed and the process is stopped.

At 118, a determination is made as to whether all the qubits of the qubit register (provided from 111) have been checked. If not, then the qubit pointer is advanced to the next qubit at 120. If so, then the test is stopped with a determination that the test was passed.

The reduction from assertion of quantum programs then follows by using, in one example, the Choi-Jamiłkowski isomorphism to prepare a state that is the all zeros state if and only if two quantum programs are identical. An example procedure for performing this evaluation is shown in flowchart 200 of FIG. 2, where the act of "check[ing] that each qubit is in the zero state" can be performed by the procedure of FIG. 1. Similarly, one can use the SWAP test to assert that two quantum programs intended for use in state preparation actually prepare identical states. An example procedure for performing the SWAP test evaluation is shown in flowchart 300 of FIG. 3, where the act of "check[ing] that each qubit is in the zero state" can be performed by the procedure of FIG. 1.

Figure 2:
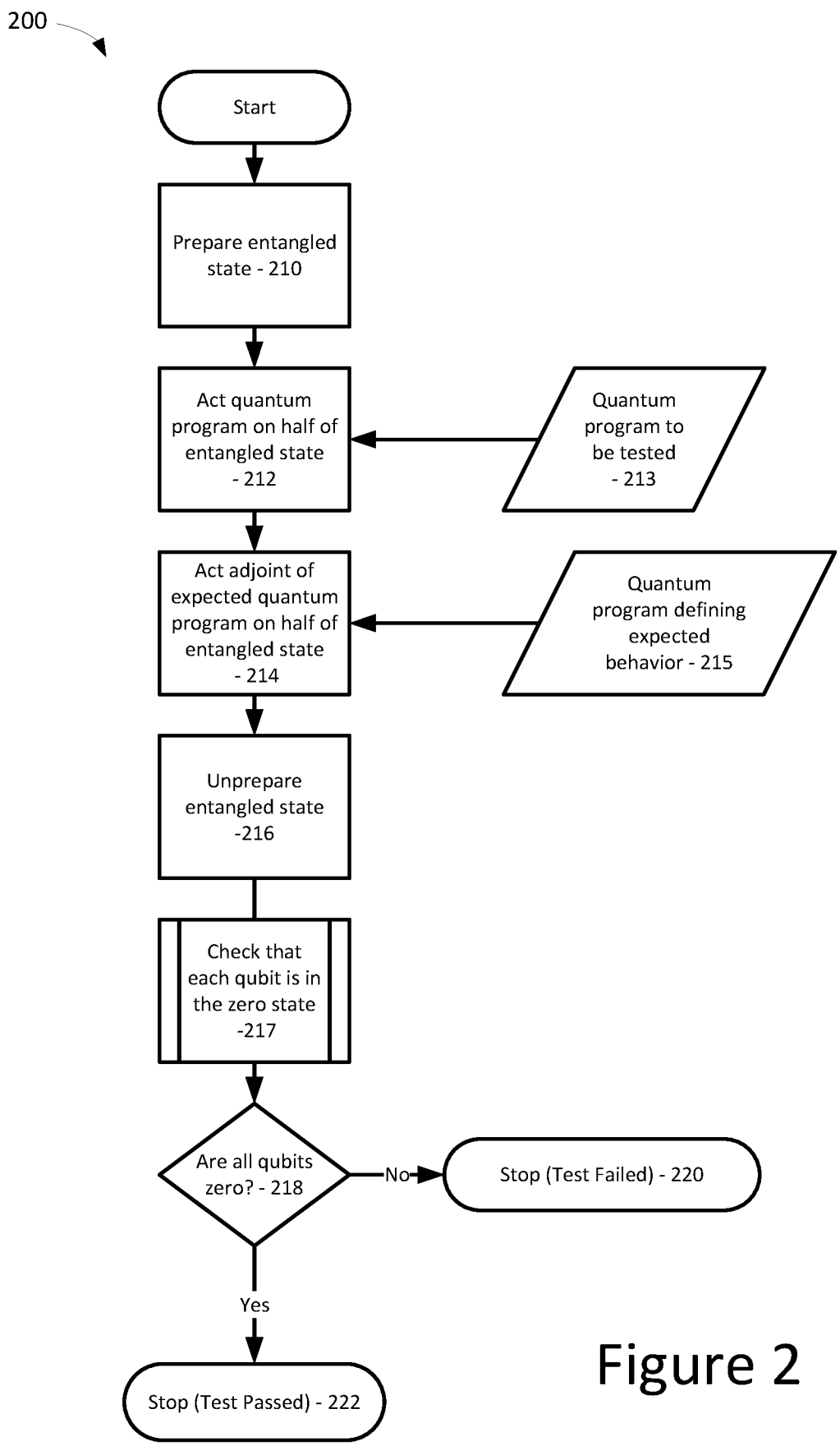
FIG. 2 is a flowchart of an example procedure for performing an evaluation where certain acts can be performed by the procedure of FIG. 1.

In more detail, FIG. 2 is a flowchart 200 showing an example embodiment for implementing an embodiment of the disclosed technology using the Choi-Jamilkowski isomorphism. The particular operations and sequence of operations should not be construed as limiting, as they can be performed alone or in any combination, subcombination, and/or sequence with one another. Additionally, the illustrated operations can be performed together with one or more other operations.

At 210, an entangled state is prepared, as described herein. This state may be prepared by acting Hadamard and controlled-NOT gates between the first and second half of a register initially in the "all zeros" state. This state may also be prepared by directly initializing the internal representation of the simulator to an entangled state such as a Bell pair. In more detail, the simplest way of preparing an entangled state is to have a Hadamard gate act on each qubit in the first half of the register and a controlled-NOT gate between corresponding pairs of qubits from each half. This is not required, however, as an implementation may simply set its internal representation of the state to be an entangled state between the two registers.

At 212, a quantum program is performed (acted) on half of entangled state. The quantum program performed is a quantum program to be tested (as shown by 213).

At 214, the inverse of a quantum program is performed (acted in reverse) on half of the entangled state. (Recall that the adjoint of an operation undoes an operation by applying the inverse of each step in reverse order). Further, in the illustrated embodiment, the quantum program applied is a quantum program defining expected behavior (as shown by 215).

At 216, the entangled state is unprepared, as described herein. The entangled state may be unprepared by performing the inverse of the quantum program (acting in reverse) used at 210 to prepare the state.

At 218, a check is made to determine whether all qubits are in the zero state (as shown by decision block 218). If not, then the process is stopped and the test is deemed failed at 220. If all qubits are in the zero state, then the process is stopped at the test is deemed to be passed at 222.

Figure 3:
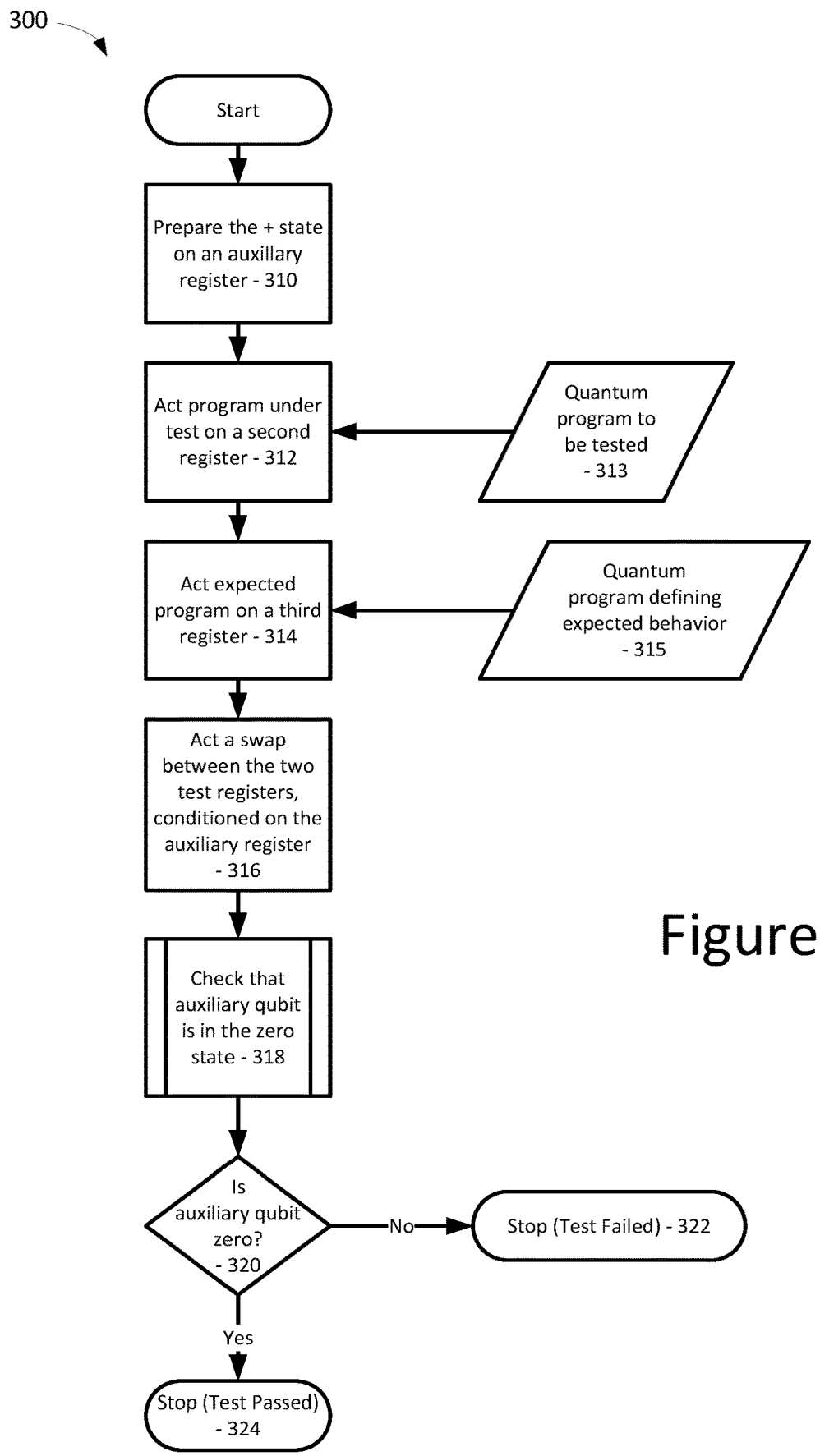
FIG. 3 is a flowchart of an example procedure for performing the SWAP test evaluation where certain acts can be performed by the procedure of FIG. 1.

In more detail, FIG. 3 is a flowchart 300 showing an example embodiment for implementing an embodiment of the disclosed technology using a SWAP test. The particular operations and sequence of operations should not be construed as limiting, as they can be performed alone or in any combination, subcombination, and/or sequence with one another. Additionally, the illustrated operations can be performed together with one or more other operations.

At 310, a plus (+) state is prepared on an auxillary register. This state may be prepared by acting a Hadamard gate on a register in the 'zero' state. This state may also be prepared by directly setting the internal representation of a simulator to the equal superposition of a 'zero' state and a 'one' state.

At 312, a quantum program to be tested (as shown by 313) is performed (acted) on a second register.

At 314, a quantum program defining expected behavior (as shown by 315) is performed (acted) on a third register.

At 316, a swap is performed (acted) between the two test registers, conditioned on the auxiliary register.

At 318, a check is made to determine whether all qubits are in the zero state (as shown by decision block 320). If not, then the process is stopped and the test is deemed failed at 322. If all qubits are in the zero state, then the process is stopped at the test is deemed to be passed at 324.

Alternatives might employ the same reduction, but with the all zeros state assertion replaced by a time-intensive simulation of a conventional quantum state tomography experiment. Other alternatives might optimize by not performing the above reduction, but by preparing a basis of different input states to the quantum programs under test and then performing quantum process tomography.

One example technical benefit of embodiments of the disclosed technology is that it avoids the infeasible large time requirements of existing alternative solutions, especially for programs acting on more than two qubits. In certain embodiments, additional memory may be used, but that additional memory greatly reduces the overall time, processing resource, power, and other processing resource burden that would be experienced by the alternative solutions.

The two alternatives described above (the Choi-Jamilkowski or SWAP test and the tomography approach), though identical in quantum experiments, differ in a simulator due to the presence of strong simulation. Consequently, certain embodiments of the disclosed technology are capable of probing the interaction of classical programs, such as pseudorandom number generators and classical control feedback, with the quantum programs under test.

III. Further Example Embodiments

The section describes various example embodiments for implementing the disclosed technology as part of a quantum simulator implemented by a classical computer in support of a quantum computing device. Embodiments of the techniques disclosed herein can be used to develop quantum program in a computationally efficiently manner that provides significant savings to processing time, power, and other computational resource usage. Thus, the technical computational savings of the disclosed approaches are significant. Still further, the disclosed techniques are significant in their contribution to developing computationally efficient techniques for writing quantum programs that are to be used to program a quantum computing device and measure results from the quantum states achieved by such devices. If such quantum programs cannot be accurately and appropriately tested ahead of time, the quantum resource cost (e.g., in terms of time, power, and resource usage) will be significant. Accordingly, the desirability of mechanisms to improve the development and significance.

III.A Testing and Debugging

As with classical programming, it is important to be able to check that quantum programs act as intended, and to be able to diagnose a quantum program that is incorrect. In this section, tools are described for testing and debugging quantum programs (e.g., written in a suitable quantum computer programming language, such as Q#).

III.A.1 Unit Tests

One common approach to testing classical programs is to write small programs called unit tests, which run code in a library and compare its output to some expected output. For instance, one may want to ensure that Square (2) returns 4, since one knows a priori that $2^2=4$.

Q# supports creating unit tests that act upon quantum programs, and which can be executed as tests within the xUnit unit testing framework.

The subsections below describe one example procedure for performing unit tests of a quantum program. The particular procedure and commands are by way of example only and can be adapted to other platforms and quantum programming languages.

III.A.1.a. Example of Creating a Test Project

Open Visual Studio 2017. Go to the File menu and select New>Project . . . . In the project template explorer, under Installed>Visual C#, select the Q# Test Project template. This will create a project with two files open.

The first file, Tests.qs, provides a convenient place to define new Q# unit tests. Initially this file contains one sample unit test AllocateQubitTest which checks that a newly allocated qubit is in the |0⟩ state and prints a message:

```
operation AllocateQubitTest ( ) : ( )
{
    body
    {
        using (qs = Qubit[1]) {
            Assert([PauliZ], [qs[0]], Zero, "Newly allocated qubit must
                be in |0> state"
        }
        Message("Test passed");
    }
}
```

More generally, tests are operations with signature ( )=>( ) or functions with the signature ( )→( ), and are identified as tests by their names, as grouped in suites by the matching C# code.

The second file, TestSuiteRunner.cs, holds test suite runners—methods annotated with OperationDriver which define what subset of tests is to be executed as part of this test suite and how to execute these tests. Initially this file contains one sample test suite TestTarget which runs all tests in the same namespace as it is which have names ending with . . . Test on QuantumSimulator. Using other arguments of OperationDriver allows to select only tests from certain assembly or with names starting or ending with certain string.

III.A.1.b. Running Q# Unit Tests

As a one-time per-solution setup, go to Test menu and select Test Settings>Default Processor Architecture>X64.

[!TIP] The default processor architecture setting for Visual Studio is stored in the solution options (.suo) file for each solution. If you delete this file, then you will need to select X64 as your processor architecture again.

Build the project, go to Test menu and select Windows>Test Explorer. AllocateQubitTest will show up in the list of tests in Not Run Tests group. Select Run All or run this individual test, and it should pass.

Alternatively, one can run Q# xUnit tests from the command line. Let's assume that a project name is QSharpTestProject1, and that it was built in Debug mode. To run tests, navigate to the project folder (the folder which contains QSharpTestProject1.csproj), and execute the command vstest.console.exe.\bin\Debug\QSharpTestProject1.dll/Platform:x64

One should get output similar to the following:
Test Execution Command Line Tool Version 15.0.26720.2
Starting test execution, please wait . . . .
Warning: Using Isolation mode to run tests as required by effective Platform:X64 and .Ne
Information: [xUnit.net 00:00:01.0018943] Discovering: QSharpTestProject1
Information: [xUnit.net 00:00:01.4948065] Discovered: QSharpTestProject1
Information: [xUnit.net 00:00:01.5081234] Starting: QSharpTestProject1
Information: [xUnit.net 00:00:02.0242517] Finished: QSharpTestProject1
Passed AllocateQubitTest
Total tests: 1. Passed: 1. Failed: 0. Skipped: 0.
Test Run Successful.
Test execution time: 3.0038 Seconds III.A.2. Logging and Assertions One consequence of the fact that functions in Q# are deterministic is that a function whose output type is the empty tuple ( ) cannot ever be observed from within a Q# program. That is, a target machine can choose not to execute any function which returns ( ) with the guarantee that this omission will not modify the behavior of any following Q# code. This makes functions a useful tool for embedding assertions and debugging logic, both of which are desirable in defining a complete suite of unit tests.

III.A.2.a. Logging

The primitive function Message has type String→( ), which enables the creation of diagnostic messages. That a target machine observes the contents of the input to Message does not imply any consequence that is observable from within Q#. A target machine may thus omit calls to Message by the same logic.

The onLog action of QuantumSimulator can be used to define action(s) performed when Q# code calls Message. By default logged messages are printed to standard output.

When defining a unit test suite, the logged messages can be directed to the test output. When a project is created from Q# Test Project template, this redirection is preconfigured for the suite and created by default as follows:

```
using (var sim = new QuantumSimulator( ))
{
    // OnLog defines action(s) performed when Q# test calls operation Message
    sim.OnLog += (msg) => { output.WriteLine(msg); };
    op.TestOperationRunner(sim);
}
```

After one executes a test in Test Explorer and clicks on the test, a panel will appear with information about test execution: Passed/Failed status, elapsed time and an "Output" link. If one clicks the "Output" link, test output will open in a new window.

III.A.2.b. Running Q# Unit Tests

The same logic can be applied to implementing assertions. Consider a simple example:

```
function AssertPositive(value : Double) : ( ) {
    if (value <= 0) {
        fail "Expected a positive number.";
    }
}
```

Here, the keyword fail indicates that the computation should not proceed, raising an exception in the target machine running the Q# program. By definition, a failure of this kind cannot be observed from within Q#, as no further Q# code is run after a fail statement is reached. Thus, if one proceeds past a call to AssertPositive, one can be assured by the anthropic principle that its input was positive, even though one is not able to directly observe this fact.

Building on these ideas, the prelude offers two especially useful assertions, both modeled as functions onto ( ): Assert and AssertProb. These assertions each take a Pauli operator describing a particular measurement of interest, a register on which a measurement is to be performed, and a hypothetical outcome. On target machines which work by simulation, one is not bound by the no-cloning theorem, and can perform such measurements without disturbing the register passed to such assertions. A simulator can then, similar to the Assert-Positive function above, abort computation if the hypothetical outcome would not be observed in practice:

```
using (register = Qubit[1]) {
    H(register[0]);
    Assert([PauliX], register, Zero);
    // Even though one does not have access to states in Q#,
    // one knows by the anthropic principle that the state
    // of register at this point is |+>.
}
```

On actual hardware, where one is constrained by physics, one can't perform such counterfactual measurements, and so the Assert and AssertProb functions simply return ( ) with no other effect.

The Microsoft.Quantum.Canon namespace, for example, provides several more functions of the Assert family which allow us to check more advanced conditions. They are detailed in Q# standard libraries: Testing and Debugging section.

III.A.3. Testing Library

As with classical program development, it is desirable to be able to diagnose mistakes and errors in quantum programs. In this section, example functions and operations are discussed. The example functions and operations are provided by the canon to assist in diagnosing quantum operations implemented in Q#, built on top of AssertProb. Many of these functions and operations rely on the fact that classical simulations of quantum mechanics need not obey the no cloning theorem, such that one can make unphysical measurements and assertions when using a simulator for a target quantum machine.

Thus, one can test individual operations on a classical simulator before deploying on hardware.

III.A.3.a. Asserts on Classical Values

As discussed in Testing and Debugging, a function or operation with signature ( )→( ) or ( )=>( ), respectively, can be called as a unit test. Such unit tests are useful in ensuring that functions and operations act as intended in known cases, and that additional features not break existing functionality. The canon provides several assertions: functions which fail if their inputs don't meet certain conditions. For instance, AssertAlmostEqual takes inputs actual:Double and expected:Double and will fail if (actual-expected) is outside the range $[-10^{-10}, 10^{-10}]$. AssertAlmostEqual is used within the canon to ensure that functions such as RealMod return the correct answer for a variety of representative cases.

More generally, the canon provides a range of functions for asserting different properties of and relations between classical values. These functions all start with prefix Assert and located in Microsoft.Quantum.Canon namespace.

III.A.3.b. Testing Qubits States

Suppose that P: Qubit=>( ) is an operation intended to prepare the state $|\psi\rangle$ when its input is in the state $|0\rangle$. Let $|\psi'\rangle$ be the actual state prepared by P. Then, $|\psi\rangle = |\psi'\rangle$ if and only if measuring $|\psi'\rangle$ in the axis described by $|\psi\rangle$ always returns Zero. That is, $$|\psi\rangle = |\psi'\rangle \text{ if and only if } \langle\psi|\psi'\rangle = 1 \qquad (1)$$

Using the primitive operations defined in the prelude, one can directly perform a measurement that returns Zero if $|\psi\rangle$ is an eigenstate of one of the Pauli operators.

In the case that the target machine is a simulator, however, one can do better, as described in Section III.A "Testing and Debugging". For example, one can use that the classical information used by a simulator to represent the internal state of a qubit is amenable to copying, such that one does not need to actually perform a measurement to test the assertion. In particular, this allows one to reason about incompatible measurements that would be impossible on actual hardware.

The operation AssertQubit provides a particularly useful shorthand to do so in the case that one wishes to test the assertion $|\psi\rangle = |0\rangle$. This is common, for instance, when one has uncomputed to return ancilla qubits to $|0\rangle$ before releasing them. Asserting against $|0\rangle$ is also useful when one wishes to assert that two state preparation P and Q operations both prepare the same state, and when Q supports Adjoint. In particular,

```
using (register = Qubit[1]) {
    P(register[0]);
    (Adjoint Q)(register[0]);
    AssertQubit(Zero, register[0]);
}
```

More generally, however, one may not have access to assertions about states that do not coincide with eigenstates of Pauli operators. For example, $|\psi\rangle = (|0\rangle + e^{i\pi/8}|1\rangle)/\sqrt{2}$ is not an eigenstate of any Pauli operator, such that one cannot use AssertProb to uniquely determine that a state $|\psi'\rangle$ is equal to $|\psi\rangle$. Instead, one must decompose the assertion $|\psi'\rangle = |\psi\rangle$ into assumptions that can be directly tested using the primitives supported by the simulator. To do so, let $|\psi\rangle = \alpha|0\rangle + \beta|1\rangle$ for complex numbers $\alpha = a_r + a_i i$ and $\beta$. Note that this expression requires four real numbers $\{a_r, a_i, b_r, b_i\}$ to specify, as each complex number can be expressed as the sum of a real and imaginary part. Due to the global phase, however, one can choose $a_i = 0$, such that one only needs three real numbers to uniquely specify a single-qubit state.

Thus, one needs to specify three assertions which are independent of each other in order to assert the state that one expects. One can do so by finding the probability of observing Zero for each Pauli measurement given $\alpha$ and $\beta$, and asserting each independently. Let x, y, and z be Result values for Pauli X, Y, and Z measurements respectively. Then, using the likelihood function for quantum measurements, $$Pr(x=\text{Zero}|\alpha,\beta) = \frac{1}{2} + a_r b_r + a_i b_i \qquad (2)$$

$$Pr(y=\text{Zero}|\alpha,\beta) = \frac{1}{2} + a_r b_i - a_i b_r \qquad (3)$$

$$Pr(z=\text{Zero}|\alpha,\beta) = \frac{1}{2}(1 + a_r^2 + a_i^2 + b_r^2 + b_i^2) \qquad (4)$$

The AssertQubitState implements these assertions given representations of $\alpha$ and $\beta$ as values of type Complex. This is helpful when the expected state can be computed mathematically.

III.A.3.c. Asserting Equality of Quantum Operations

Thus far, there has been concern with testing operations which are intended to prepare particular states. Often, however, there is also interest in how an operation acts for arbitrary inputs rather than for a single fixed input. For example, suppose one has implemented an operation U:((Double, Qubit[ ])=>( ):Adjoint) corresponding to a family of unitary operators U(t), and has provided an explicit adjoint block instead of using adjoint auto. One may be interested in asserting that $U^\dagger(t) = U(-t)$, as expected if t represents an evolution time.

Broadly speaking, there are two different strategies that one can follow in making the assertion that two operations U and V act identically. First, one can check that U(target); (Adjoint V)(target); preserves each state in a given basis. Second, one can check that U(target); (Adjoint V)(target); acting on half of an entangled state preserves that entanglement. These strategies are implemented by the canon operations AssertOperationsEqualInPlace and AssertOperationsEqualReferenced, respectively.

The referenced assertion discussed above works based on the Choi-Jamiłkowski isomorphism, a mathematical framework which relates operations on n qubits to entangled states on 2n qubits. In particular the identity operation on n qubits is represented by n copies of the entangled state $|\beta_{00}\rangle := (|00\rangle + |11\rangle)/\sqrt{2}$. The operation PrepareChoiState implements this isomorphism, preparing a state that represents a given operation.

Roughly, these strategies are distinguished by a time-space tradeoff. Iterating through each input state takes additional time, while using entanglement as a reference requires storing additional qubits. In cases where an operation implements a reversible classical operation, such that one is only interested in its behavior on computational basis states, AssertOperationsEqualInPlaceCompBasis tests equality on this restricted set of inputs.

The iteration over input states is handled by the enumeration operations IterateThroughCartesianProduct and IterateThroughCartesianPower. These operations are useful more generally for applying an operation to each element of the Cartesian product between two or more sets.

More critically, however, the two approaches test different properties of the operations under examination. Since the in-place assertion calls each operation multiple times, once for each input state, any random choices and measurement results might change between calls. By contrast, the referenced assertion calls each operation exactly once, such that it checks that the operations are equal in a single shot. Both of these tests are useful in ensuring the correctness of quantum programs.

IV. Example Computing Environments

Figure 4:
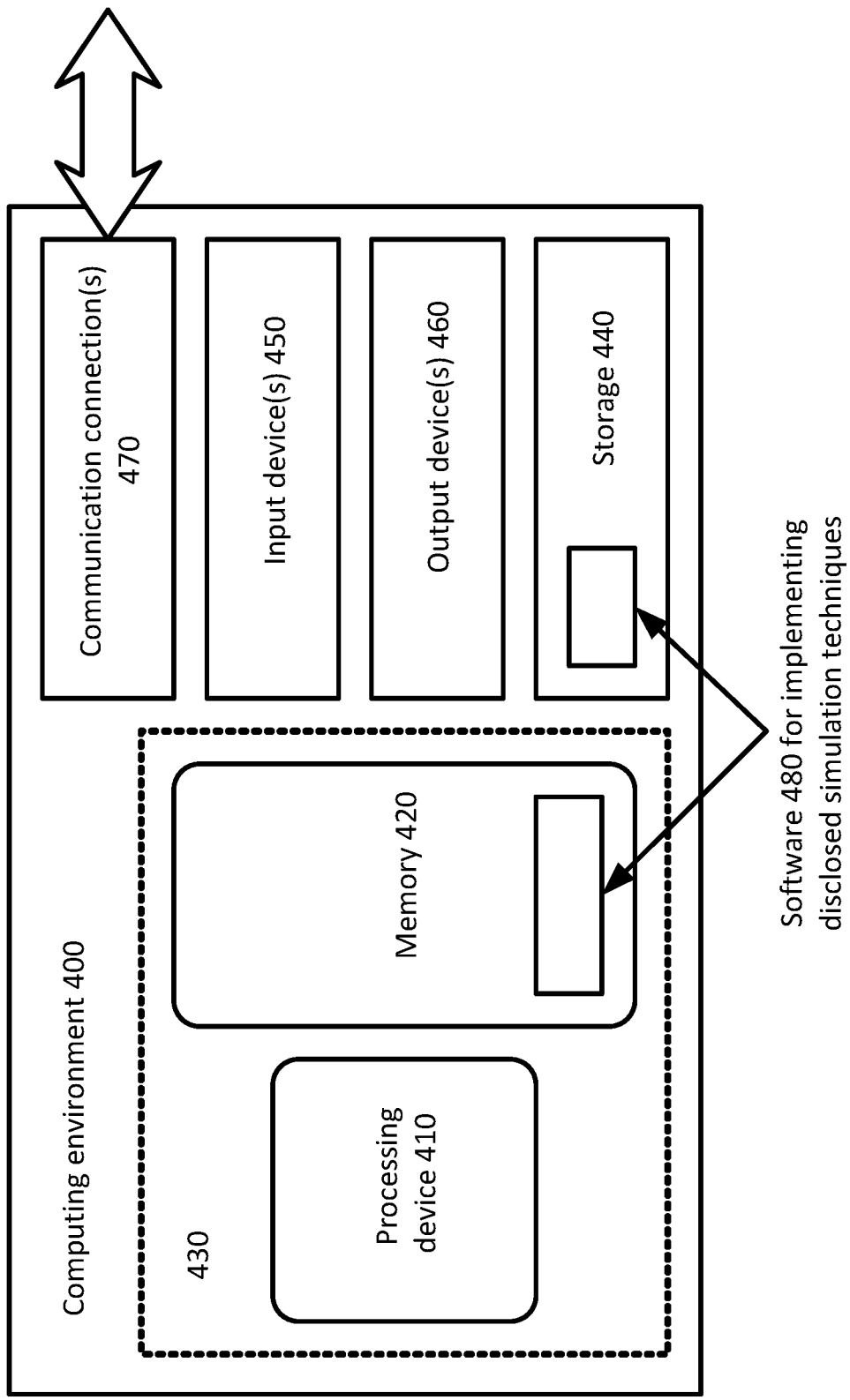
FIG. 4 illustrates a generalized example of a suitable classical computing environment in which several of the described embodiments can be implemented.

FIG. 4 illustrates a generalized example of a suitable classical computing environment 400 in which several of the described embodiments can be implemented. The computing environment 400 is not intended to suggest any limitation as to the scope of use or functionality of the disclosed technology, as the techniques and tools described herein can be implemented in diverse general-purpose or special-purpose environments that have computing hardware.

With reference to FIG. 4, the computing environment 400 includes at least one processing device 410 and memory 420. In FIG. 4, this most basic configuration 430 is included within a dashed line. The processing device 410 (e.g., a CPU or microprocessor) executes computer-executable instructions. In a multi-processing system, multiple processing devices execute computer-executable instructions to increase processing power. The memory 420 may be volatile memory (e.g., registers, cache, RAM, DRAM, SRAM), non-volatile memory (e.g., ROM, EEPROM, flash memory), or some combination of the two. The memory 420 stores software 480 implementing tools for performing any of the simulation techniques as described herein. The memory 420 can also store software 480 for simulating and testing quantum programs as described herein, as well as software 480 for synthesizing, generating, or compiling quantum circuits resulting from the tested quantum programs.

The computing environment can have additional features. For example, the computing environment 400 includes storage 440, one or more input devices 450, one or more output devices 460, and one or more communication connections 470. An interconnection mechanism (not shown), such as a bus, controller, or network, interconnects the components of the computing environment 400. Typically, operating system software (not shown) provides an operating environment for other software executing in the computing environment 400, and coordinates activities of the components of the computing environment 400.

The storage 440 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 400. The storage 440 can also store instructions for the software 480 implementing any of the disclosed simulation techniques. The storage 440 can also store instructions for the software 480 for generating and/or synthesizing any of the described techniques, systems, or reversible circuits.

The input device(s) 450 can be a touch input device such as a keyboard, touchscreen, mouse, pen, trackball, a voice input device, a scanning device, or another device that provides input to the computing environment 400. The output device(s) 460 can be a display device (e.g., a computer monitor, laptop display, smartphone display, tablet display, netbook display, or touchscreen), printer, speaker, or another device that provides output from the computing environment 400.

The communication connection(s) 470 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods, simulation techniques, circuit design techniques, or compilation/synthesis techniques can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 420 and/or storage 440, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 5:
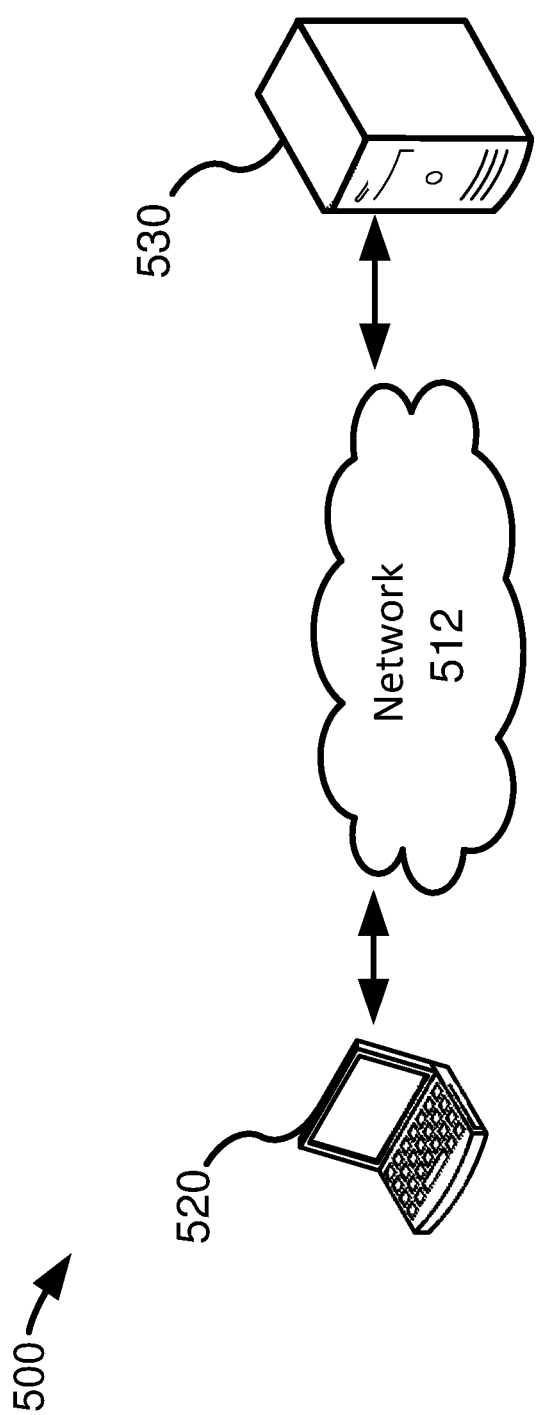
FIG. 5 is an example of a possible network topology (e.g., a client-server network) for implementing a system according to the disclosed technology.

An example of a possible network topology 500 (e.g., a client-server network) for implementing a system according to the disclosed technology is depicted in FIG. 5. Networked computing device 520 can be, for example, a computer running a browser or other software connected to a network 512. The computing device 520 can have a computer architecture as shown in FIG. 5 and discussed above. The computing device 520 is not limited to a traditional personal computer but can comprise other computing hardware configured to connect to and communicate with a network 512 (e.g., smart phones, laptop computers, tablet computers, or other mobile computing devices, servers, network devices, dedicated devices, and the like). Further, the computing device 520 can comprise an FPGA or other programmable logic device. In the illustrated embodiment, the computing device 520 is configured to communicate with a computing device 530 (e.g., a remote server, such as a server in a cloud computing environment) via a network 512. In the illustrated embodiment, the computing device 520 is configured to transmit input data to the computing device 530, and the computing device 530 is configured to implement a quantum program simulation technique according to any of the disclosed embodiments and/or a circuit generation or compilation/synthesis methods for generating quantum circuits based on or in conjunction with any of the quantum program simulation techniques disclosed herein. The computing device 530 can output results to the computing device 520. Any of the data received from the computing device 530 can be stored or displayed on the computing device 520 (e.g., displayed as data on a graphical user interface or web page at the computing devices 520). In the illustrated embodiment, the illustrated network 512 can be implemented as a Local Area Network ("LAN") using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 512 can be the Internet or a similar public network and operate using an appropriate protocol (e.g., the HITP protocol).

Figure 6:
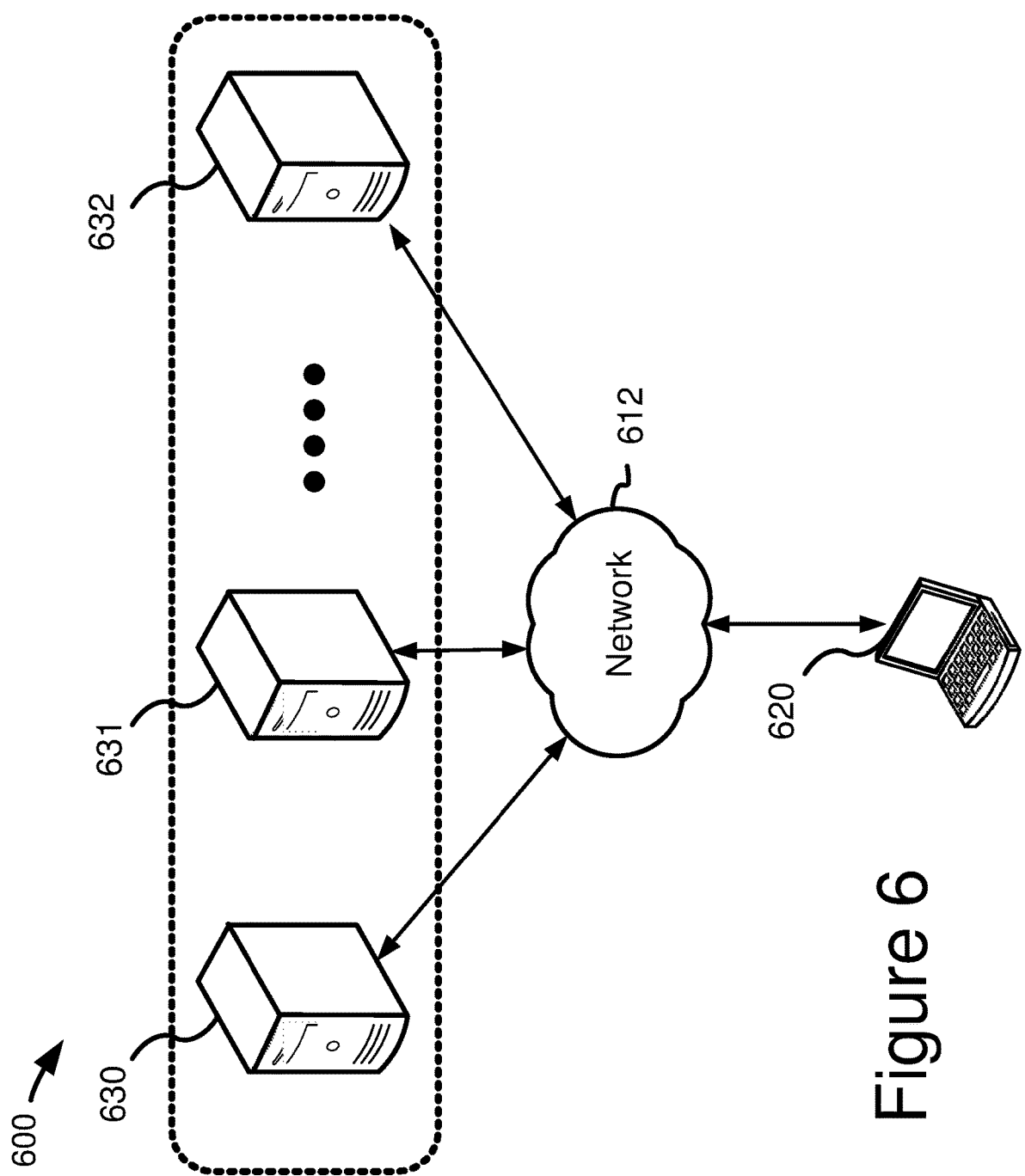
FIG. 6 is another example of a possible network topology (e.g., a distributed computing environment) for implementing a system according to the disclosed technology is depicted.

Another example of a possible network topology 600 (e.g., a distributed computing environment) for implementing a system according to the disclosed technology is depicted in FIG. 6. Networked computing device 620 can be, for example, a computer running a browser or other software connected to a network 612. The computing device 620 can have a computer architecture as shown in FIG. 4 and discussed above. In the illustrated embodiment, the computing device 620 is configured to communicate with multiple computing devices 630, 631, 632 (e.g., remote servers or other distributed computing devices, such as one or more servers in a cloud computing environment) via the network 612. In the illustrated embodiment, each of the computing devices 630, 631, 632 in the computing environment 600 is used to perform at least a portion of a quantum program simulation technique (as disclosed herein) and/or a synthesis/compilation process. In other words, the computing devices 630, 631, 632 form a distributed computing environment in which the quantum program simulation technique (as disclosed herein) and/or generation/compilation/synthesis processes are shared across multiple computing devices. The computing device 620 is configured to transmit input data to the computing devices 630, 631, 632, which are configured to distributively implement such as process, including performance of any of the disclosed methods or creation of any of the disclosed circuits, and to provide results to the computing device 620. Any of the data received from the computing devices 630, 631, 632 can be stored or displayed on the computing device 620 (e.g., displayed as data on a graphical user interface or web page at the computing devices 620). The illustrated network 612 can be any of the networks discussed above with respect to FIG. 5.

Figure 7:
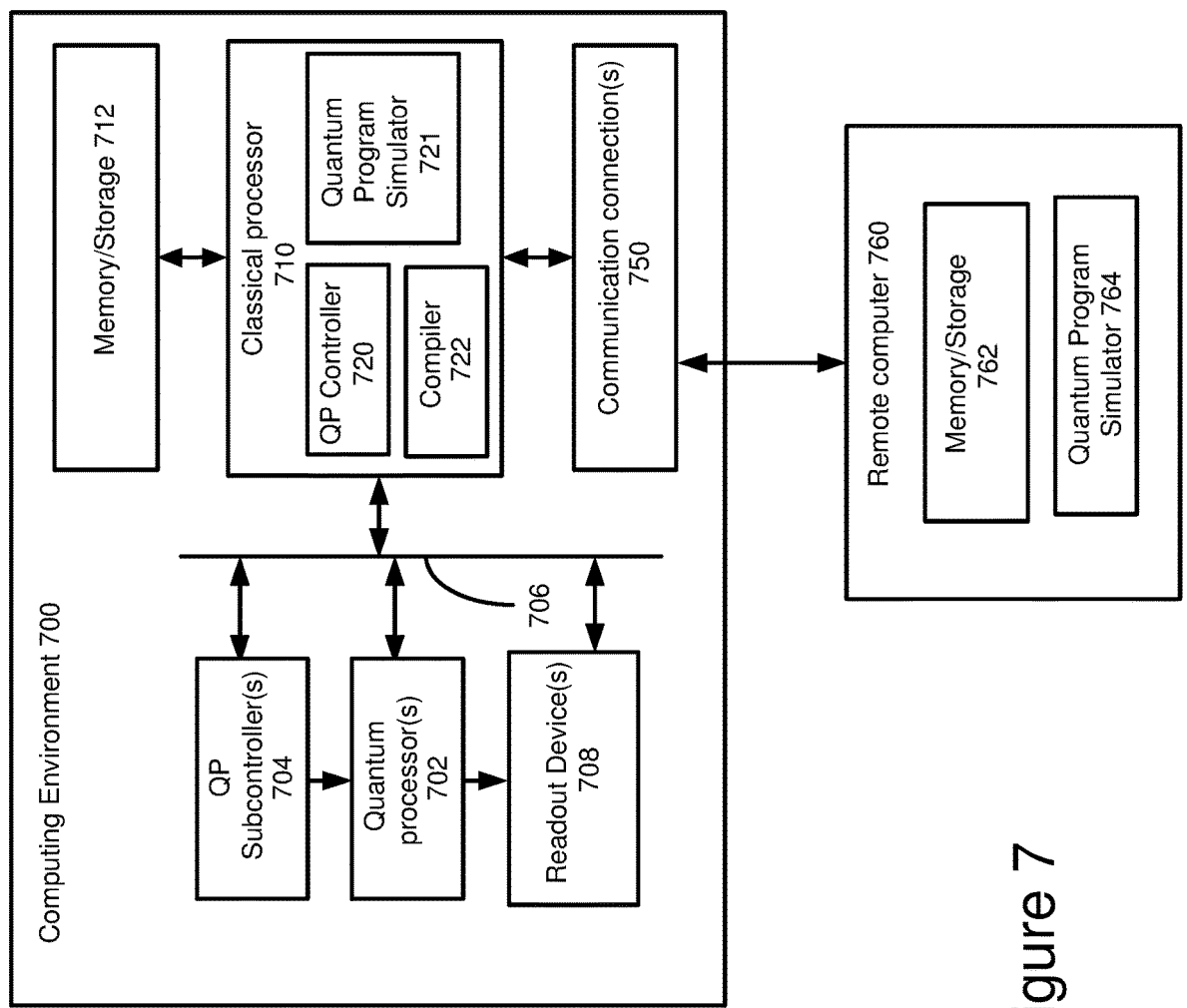
FIG. 7 is an exemplary system for implementing the disclosed technology that includes a classical computing environment and a quantum computing environment.

With reference to FIG. 7, an exemplary system for implementing the disclosed technology includes computing environment 700. In computing environment 700, a compiled quantum computer circuit description (including quantum circuits resulting from and/or supported by any of the quantum program simulation techniques as disclosed herein) can be used to program (or configure) one or more quantum processing units such that the quantum processing unit(s) implement the circuit described by the quantum computer circuit description.

The environment 700 includes one or more quantum processing units 702 and one or more readout device(s) 708. The quantum processing unit(s) execute quantum circuits that are precompiled and described by the quantum computer circuit description. The quantum processing unit(s) can be one or more of, but are not limited to: (a) a superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 706 at the control of quantum processor controller 720. The quantum processor controller (QP controller) 720 can operate in conjunction with a classical processor 710 (e.g., having an architecture as described above with respect to FIG. 4) to implement the desired quantum computing process. In the illustrated example, the QP controller 720 further implements the desired quantum computing process via one or more QP subcontrollers 704 that are specially adapted to control a corresponding one of the quantum processor(s) 702. For instance, in one example, the quantum controller 720 facilitates implementation of the compiled quantum circuit by sending instructions to one or more memories (e.g., lower-temperature memories), which then pass the instructions to low-temperature control unit(s) (e.g., QP subcontroller(s) 704) that transmit, for instance, pulse sequences representing the gates to the quantum processing unit(s) 702 for implementation. In other examples, the QP controller(s) 720 and QP subcontroller(s) 704 operate to provide appropriate magnetic fields, encoded operations, or other such control signals to the quantum processor(s) to implement the operations of the compiled quantum computer circuit description. The quantum controller(s) can further interact with readout devices 708 to help control and implement the desired quantum computing process (e.g., by reading or measuring out data results from the quantum processing units once available, etc.)

With reference to FIG. 7, compilation is the process of translating a high-level description of a quantum algorithm into a quantum computer circuit description comprising a sequence of quantum operations or gates, which can include the circuits as disclosed herein. The compilation can be performed by a compiler 722 using a classical processor 710 (e.g., as shown in FIG. 4) of the environment 700 which loads the high-level description from memory or storage devices 712 and stores the resulting quantum computer circuit description in the memory or storage devices 712. Additionally, a simulator 721 can be used to test the correctness of the quantum program using any of the disclosed testing techniques.

In other embodiments, compilation and/or quantum program simulation can be performed remotely by a remote computer 760 (e.g., a computer having a computing environment as described above with respect to FIG. 4) which stores the resulting quantum computer circuit description in one or more memory or storage devices 762 and transmits the quantum computer circuit description to the computing environment 700 for implementation in the quantum processing unit(s) 702. For instance, with reference to FIG. 7, remote computer 760 includes a quantum program simulator 764 that can be perform any of the simulation techniques disclosed herein. Still further, the remote computer 700 can store the high-level description in the memory or storage devices 762 and transmit the high-level description to the computing environment 700 for compilation and use with the quantum processor(s).

In any of these scenarios, results from the computation performed by the quantum processor(s) can be communicated to the remote computer after and/or during the computation process. Still further, the remote computer can communicate with the QP controller(s) 720 such that the quantum computing process (including any compilation, simulation, and QP control procedures) can be remotely controlled by the remote computer 760. In general, the remote computer 760 communicates with the QP controller(s) 720, compiler/synthesizer 722, quantum program simulator 721, via communication connections 750.

In particular embodiments, the environment 700 can be a cloud computing environment, which provides the quantum processing resources of the environment 700 to one or more remote computers (such as remote computer 760) over a suitable network (which can include the internet).

V. Further Example Embodiments

Figure 8:
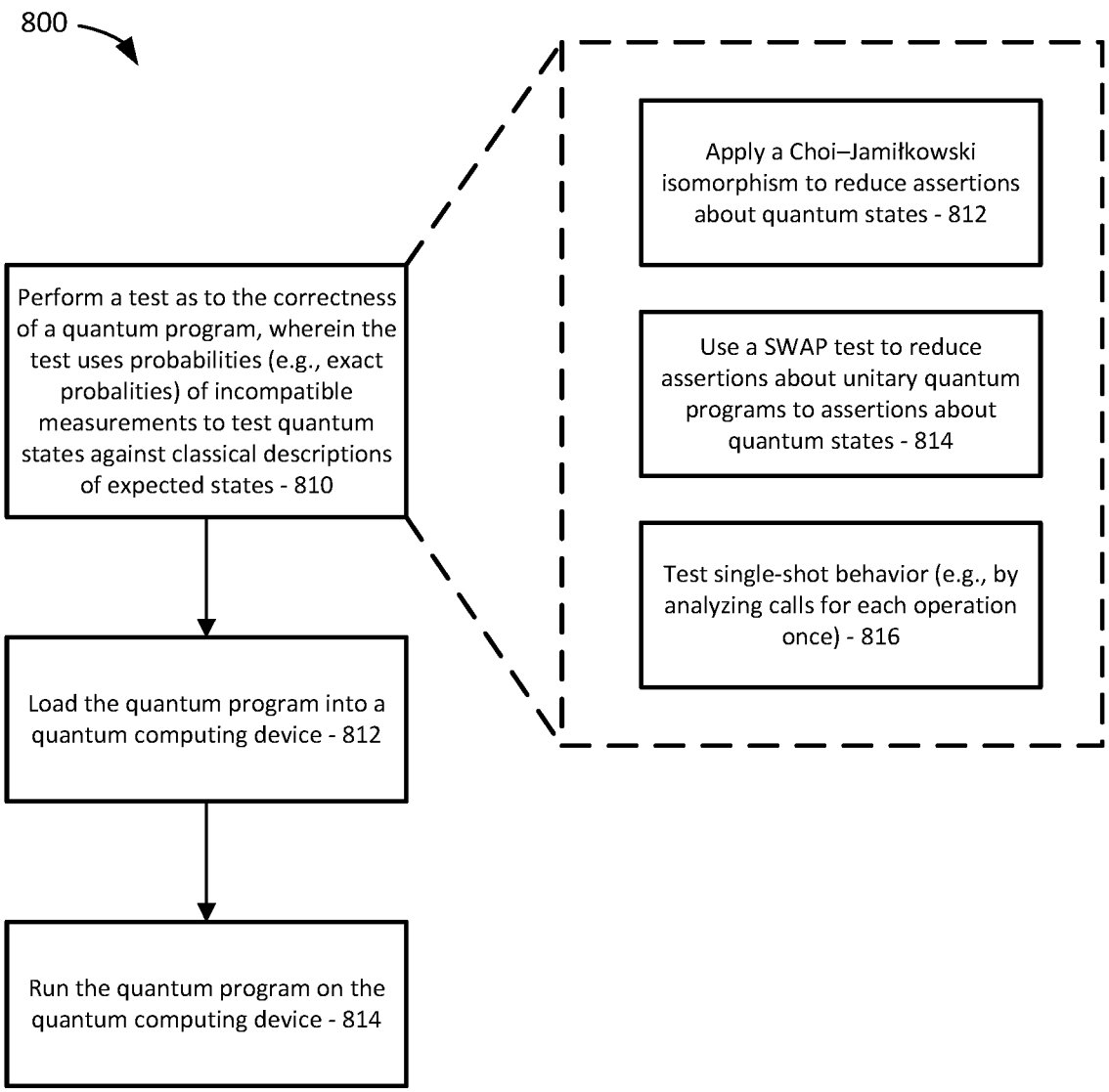
FIG. 8 is a flowchart of another example procedure for performing a test as to the correctness of a quantum program.

FIG. 8 is a flowchart 800 showing a generalized example embodiment for implementing an embodiment of the disclosed technology. The particular operations and sequence of operations should not be construed as limiting, as they can be performed alone or in any combination, subcombination, and/or sequence with one another. Additionally, the illustrated operations can be performed together with one or more other operations.

As shown at 812, the testing comprises applying a Choi-Jamiłkowski isomorphism to reduce assertions about quantum states.

As shown at 814, the testing comprises using a SWAP test to reduce assertions about unitary quantum programs to assertions about quantum states.

As shown at 816, the testing comprises testing of single-shot behavior. For example, the testing of single-shot behavior analyzes calls for each operation once.

Further, at 820, the quantum program is loaded into a quantum computing device.

Further, at 822, the quantum program is run on the quantum computing device.

VI. Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

The invention claimed is:

1. A method of testing a quantum program, comprising:
preparing an entangled state from an initial state;
acting a quantum program under test to half of the entangled state;
acting an adjoint of a quantum program defining expected behavior on the half of the entangled state;
unpreparing the entangled state; and
verifying the quantum program under test based on a comparison of the unprepared entangled state and the initial state.

2. The method of claim 1, wherein the testing is performed by a strong quantum simulator implemented in a classical computing device.

3. The method of claim 1, further comprising:
loading the quantum program into a quantum computing device; and
running the quantum program on the quantum computing device.

4. The method of claim 1, wherein the initial state is an all zeros state.

5. The method of claim 1, wherein the testing comprises testing of single-shot behavior.

6. The method of claim 5, wherein the testing of single-shot behavior analyzes calls for each operation once.

7. One or more computer-readable media storing computer-executable instructions, which when executed by a processor cause the processor to perform a method, the method comprising:
preparing an entangled state from an initial state;
acting a quantum program under test to half of the entangled state;
acting an adjoint of a quantum program defining expected behavior on the half of the entangled state;
unpreparing the entangled state; and
determining the correctness of the quantum program under test based on a comparison of the unprepared entangled state and the initial state.

8. The one or more computer-readable media of claim 7, wherein the testing is performed by a strong quantum simulator implemented in a classical computing device.

9. The one or more computer-readable media of claim 7, wherein the method further comprises:
loading the quantum program into a quantum computing device; and
running the quantum program on the quantum computing device.

10. The one or more computer-readable media of claim 7, wherein the testing comprises testing of a single-shot behavior.

11. The one or more computer-readable media of claim 10, wherein the testing of the single-shot behavior analyzes calls for each operation once.

12. A system, comprising:
a quantum computing device; and
a classical computing device in communication with the quantum computing device and adapted to perform a method, the method comprising:
testing correctness of a quantum program by
preparing an entangled state from an initial state;
acting a quantum program under test to half of the entangled state;
acting an adjoint of a quantum program defining expected behavior on the half of the entangled state;
unpreparing the entangled state; and
determining the correctness of the quantum program to be tested based on a comparison of the unprepared entangled state and the initial state.

13. The system of claim 12, wherein the testing is performed by a strong quantum simulator implemented in a classical computing device.

14. The system of claim 12, wherein the method further comprises:
loading the quantum program into a quantum computing device; and running the quantum program on the quantum computing device.

15. The system of claim 12, wherein the the initial state is an all zeros state.

16. The system of claim 12, wherein the testing comprises analyzing calls for each operation once.

* * * * *